(12) United States Patent
Reynolds

(10) Patent No.: US 9,348,477 B2
(45) Date of Patent: May 24, 2016

(54) METHODS AND SYSTEMS FOR DETECTING A POSITION-BASED ATTRIBUTE OF AN OBJECT USING DIGITAL CODES

(71) Applicant: SYNAPTICS INCORPORATED, San Jose, CA (US)

(72) Inventor: J. Kurth Reynolds, Sunnyvale, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 14/580,914

(22) Filed: Dec. 23, 2014

(65) Prior Publication Data

US 2015/0185920 A1    Jul. 2, 2015

Related U.S. Application Data

(63) Continuation of application No. 14/024,312, filed on Sep. 11, 2013, now Pat. No. 8,952,916, which is a continuation of application No. 13/679,355, filed on Nov. 16, 2012, now Pat. No. 8,558,811, which is a
(Continued)

(51) Int. Cl.
*G06F 3/044* (2006.01)
*G06F 3/041* (2006.01)
*H03K 17/96* (2006.01)

(52) U.S. Cl.
CPC ............... *G06F 3/044* (2013.01); *G06F 3/041* (2013.01); *G06F 3/0416* (2013.01); *H03K 17/962* (2013.01)

(58) Field of Classification Search
CPC ........ G06F 3/044; G06F 3/041; G06F 3/0416
See application file for complete search history.

(56) References Cited

U.S. PATENT DOCUMENTS

| 497,786 A | 5/1893 | Griffiths et al. |
| 4,087,625 A | 5/1978 | Dym et al. |
| 4,145,748 A | 3/1979 | Eichelberger et al. |
| 4,250,503 A | 2/1981 | Shanks |

(Continued)

FOREIGN PATENT DOCUMENTS

| CN | 1182231 A | 5/1998 |
| CN | 101310246 B | 7/2012 |

(Continued)

OTHER PUBLICATIONS

Benjamin Vigoda, "A Nonlinear Dynamic System for Spread Spectrum Code Acquisition"; MIT Media Laboratory; pp. 10-90, 82 pages.

(Continued)

*Primary Examiner* — Kevin M Nguyen
(74) *Attorney, Agent, or Firm* — Osha Liang LLP

(57) ABSTRACT

Methods, systems and devices are described for detecting a position-based attribute of a finger, stylus or other object with a touchpad or other sensor having a touch-sensitive region that includes a plurality of electrodes. Modulation signals for one or more electrodes are produced as a function of any number of distinct digital codes. The modulation signals are applied to an associated at least one of the plurality of electrodes to obtain a resultant signal that is electrically affected by the position of the object. The resultant signal is demodulated using the plurality of distinct digital codes to discriminate electrical effects produced by the object. The position-based attribute of the object is then determined with respect to the plurality of electrodes from the electrical effects.

44 Claims, 5 Drawing Sheets

Related U.S. Application Data continuation of application No. 12/962,096, filed on Dec. 7, 2010, now Pat. No. 8,338,724, which is a continuation of application No. 11/274,999, filed on Nov. 15, 2005, now Pat. No. 7,868,874.

(56) References Cited

U.S. PATENT DOCUMENTS

| | | | |
|---|---|---|---|
| 4,264,903 A | 4/1981 | Bigelow | |
| 4,266,144 A | 5/1981 | Bristol | |
| 4,455,452 A | 6/1984 | Schuyler | |
| 4,507,523 A | 3/1985 | Gohara et al. | |
| 4,571,454 A | 2/1986 | Tamaru et al. | |
| 4,698,461 A | 10/1987 | Meadows et al. | |
| 4,733,222 A | 3/1988 | Evans | |
| 4,794,208 A | 12/1988 | Watson | |
| 4,922,061 A | 5/1990 | Meadows et al. | |
| 5,016,008 A | 5/1991 | Gruaz et al. | |
| 5,101,406 A | 3/1992 | Messenger | |
| 5,231,381 A | 7/1993 | Duwaer | |
| 5,305,017 A | 4/1994 | Gerpheide | |
| 5,374,787 A | 12/1994 | Miller et al. | |
| 5,461,320 A | 10/1995 | Strack et al. | |
| 5,463,388 A | 10/1995 | Boie et al. | |
| 5,463,657 A | 10/1995 | Rice | |
| 5,488,204 A | 1/1996 | Mead et al. | |
| 5,510,813 A | 4/1996 | Makinwa et al. | |
| 5,526,294 A | 6/1996 | Ono et al. | |
| 5,565,658 A | 10/1996 | Gerpheide et al. | |
| 5,673,041 A | 9/1997 | Chatigny et al. | |
| 5,796,827 A | 8/1998 | Coppersmith et al. | |
| 5,798,756 A | 8/1998 | Yoshida et al. | |
| 5,825,352 A | 10/1998 | Bisset et al. | |
| 5,831,600 A | 11/1998 | Inoue et al. | |
| 5,841,078 A * | 11/1998 | Miller et al. | 178/18.06 |
| 5,844,506 A | 12/1998 | Binstead | |
| 5,880,411 A | 3/1999 | Gillespie et al. | |
| 5,905,489 A | 5/1999 | Takahama et al. | |
| 5,914,610 A | 6/1999 | Gershenfeld et al. | |
| 5,914,701 A | 6/1999 | Gersheneld et al. | |
| 5,920,309 A | 7/1999 | Bisset et al. | |
| 5,945,980 A | 8/1999 | Moissev et al. | |
| 5,982,809 A | 11/1999 | Liu et al. | |
| 6,009,074 A | 12/1999 | Kim et al. | |
| 6,025,726 A | 2/2000 | Gershenfeld et al. | |
| 6,043,810 A | 3/2000 | Kim et al. | |
| 6,075,520 A | 6/2000 | Inoue et al. | |
| 6,137,427 A | 10/2000 | Binstead | |
| 6,210,771 B1 | 4/2001 | Post et al. | |
| 6,222,528 B1 | 4/2001 | Gerpheide et al. | |
| 6,243,080 B1 | 6/2001 | Molne | |
| 6,288,707 B1 | 9/2001 | Philipp | |
| 6,320,282 B1 | 11/2001 | Caldwell | |
| 6,323,846 B1 | 11/2001 | Westerman et al. | |
| 6,366,099 B1 | 4/2002 | Reddi | |
| 6,373,265 B1 | 4/2002 | Morimoto et al. | |
| 6,392,167 B1 | 5/2002 | Nakagawa | |
| 6,404,416 B1 | 6/2002 | Kahn et al. | |
| 6,452,514 B1 | 9/2002 | Philipp | |
| 6,459,424 B1 | 10/2002 | Resman | |
| 6,462,563 B1 | 10/2002 | Kawahara et al. | |
| 6,466,036 B1 | 10/2002 | Philipp | |
| 6,498,590 B1 | 12/2002 | Dietz et al. | |
| 6,525,547 B2 | 2/2003 | Hayes | |
| 6,647,059 B1 | 11/2003 | Faruque | |
| 6,730,863 B1 | 5/2004 | Gerpheide et al. | |
| 6,762,753 B2 | 7/2004 | Satoh et al. | |
| 6,819,316 B2 | 11/2004 | Schulz et al. | |
| 6,856,259 B1 | 2/2005 | Sharp | |
| 6,888,536 B2 | 5/2005 | Westerman et al. | |
| 6,947,032 B2 | 9/2005 | Morrison et al. | |
| 6,990,435 B2 | 1/2006 | Kaneko et al. | |
| 7,027,484 B1 | 4/2006 | Tiedemann, Jr. | |
| 7,046,230 B2 | 5/2006 | Zadesky et al. | |
| 7,075,316 B2 | 7/2006 | Umeda et al. | |
| 7,079,516 B2 | 7/2006 | You et al. | |
| 7,084,645 B1 | 8/2006 | Umeda et al. | |
| 7,084,860 B1 | 8/2006 | Jaeger et al. | |
| 7,113,175 B2 | 9/2006 | Liu et al. | |
| 7,146,024 B2 | 12/2006 | Benkley, III | |
| 7,180,508 B2 | 2/2007 | Kent et al. | |
| 7,215,698 B2 | 5/2007 | Darby et al. | |
| 7,388,571 B2 | 6/2008 | Lowles et al. | |
| 7,411,584 B2 | 8/2008 | Hill et al. | |
| 7,430,257 B1 | 9/2008 | Shattil | |
| 7,436,393 B2 | 10/2008 | Hong et al. | |
| 7,453,444 B2 | 11/2008 | Geaghan | |
| 7,495,659 B2 | 2/2009 | Marriott et al. | |
| 7,589,713 B2 | 9/2009 | Sato | |
| 7,605,804 B2 | 10/2009 | Wilson | |
| 7,616,192 B2 | 11/2009 | Schroeder | |
| 7,663,607 B2 | 2/2010 | Hotelling et al. | |
| 7,693,037 B2 | 4/2010 | Schotten | |
| 7,719,515 B2 | 5/2010 | Fujiwara et al. | |
| RE41,731 E | 9/2010 | Dietz et al. | |
| 7,812,825 B2 | 10/2010 | Sinclair et al. | |
| 7,821,502 B2 | 10/2010 | Hristov | |
| 7,825,905 B2 | 11/2010 | Philipp | |
| 7,902,840 B2 | 3/2011 | Zachut et al. | |
| 7,991,920 B2 | 8/2011 | Back et al. | |
| 8,164,573 B2 | 4/2012 | DaCosta et al. | |
| 8,217,915 B2 | 7/2012 | Philipp | |
| 8,569,636 B2 * | 10/2013 | Yeh et al. | 178/18.02 |
| 8,938,021 B1 | 1/2015 | Henry | |
| 2002/0036621 A1 | 3/2002 | Liu et al. | |
| 2002/0049070 A1 | 4/2002 | Bick | |
| 2002/0050983 A1 | 5/2002 | Liu et al. | |
| 2002/0071384 A1 | 6/2002 | Hall et al. | |
| 2002/0075163 A1 | 6/2002 | Smith et al. | |
| 2002/0097231 A1 | 7/2002 | Satoh et al. | |
| 2002/0097703 A1 | 7/2002 | Nieczyporowicz et al. | |
| 2002/0149572 A1 | 10/2002 | Schulz et al. | |
| 2002/0157880 A1 | 10/2002 | Atwood et al. | |
| 2002/0185999 A1 * | 12/2002 | Tajima et al. | 324/76.75 |
| 2003/0016849 A1 | 1/2003 | Andrade | |
| 2003/0098858 A1 | 5/2003 | Perski et al. | |
| 2003/0110440 A1 | 6/2003 | Gutierrez | |
| 2003/0112226 A1 | 6/2003 | Le-Pailleur | |
| 2003/0222856 A1 | 12/2003 | Fedorak et al. | |
| 2004/0013168 A1 | 1/2004 | Haines et al. | |
| 2004/0022177 A1 | 2/2004 | Awad et al. | |
| 2004/0061687 A1 | 4/2004 | Kent et al. | |
| 2004/0080486 A1 * | 4/2004 | Troxell et al. | 345/156 |
| 2004/0119701 A1 | 6/2004 | Mulligan et al. | |
| 2004/0155991 A1 | 8/2004 | Lowles et al. | |
| 2005/0005703 A1 * | 1/2005 | Saito et al. | 73/780 |
| 2005/0041018 A1 | 2/2005 | Philipp | |
| 2005/0052428 A1 | 3/2005 | Hayashi et al. | |
| 2006/0181524 A1 | 8/2006 | Nakazawa et al. | |
| 2006/0220788 A1 | 10/2006 | Dietz et al. | |
| 2006/0221061 A1 | 10/2006 | Fry | |
| 2006/0262101 A1 | 11/2006 | Layton et al. | |
| 2007/0070046 A1 | 3/2007 | Sheynblat et al. | |
| 2007/0074913 A1 | 4/2007 | Geaghan et al. | |

FOREIGN PATENT DOCUMENTS

| | | |
|---|---|---|
| CN | 102841704 A | 12/2012 |
| EP | 0749068 A1 | 12/1996 |
| EP | 0749086 A1 | 12/1996 |
| EP | 1289181 A1 | 3/2003 |
| EP | 1710672 A2 | 10/2006 |
| GB | 1525649 A | 9/1978 |
| GB | 2072389 A | 9/1981 |
| JP | 2000286986 A | 10/2000 |
| JP | 2002366291 A | 12/2002 |
| JP | 2005300504 A | 10/2005 |
| JP | 2008179871 A | 8/2008 |
| JP | 2009516295 A | 4/2009 |
| JP | 2013229032 A | 11/2013 |
| JP | 5714978 B2 | 5/2015 |
| WO | 9731238 A1 | 8/1997 |

(56) References Cited

FOREIGN PATENT DOCUMENTS

| WO | 0247018 A2 | 6/2002 |
|---|---|---|
| WO | 2004057552 A1 | 7/2004 |
| WO | 2007058727 A1 | 5/2007 |

OTHER PUBLICATIONS

Cichocki, et al.; "A Switched-Capacitor Interface for Capacitive Sensors Based on Relaxation Oscillators"; IEEE Journal; Oct. 1990; pp. 797-799; vol. 39, No. 5, 3 pages.
David Allport, et al, "Electric Field Sensing and the 'Flying Fish'," MIT Media Laboratory, Jun. 1995, 21 pages.
Hal Philipp, "Charge Transfer Sensing," pp. 1-9, 1997, 12 pages.
Huang, et al.; "Electronic Transducers for Industrial Measurement of Low Value Capacitances"; J. Phys. E: Sci. Instrum. 21 1988; pp. 242-250; IOP Publishing Printed in the U.K., 10 pages.
Joshua R. Smith, "Activating Space with Electric Field Sensing," Proposal for SIGGRAPH95 Technical Sketch, May 30, 1995, 2 pages.
Joshua R. Smith, "Electric Field Imaging," MIT Dissertation, Feb. 1999, 216 pages.
Joshua R. Smith, "Toward Electric Field Tomography," MIT Master's Dissertation, Aug. 1995, 56 pages.
Joshua R. Smith, et al.; "Code-Division Multiplexing of a Sensor Channel: A Software Implementation"; IEEE Journal; Apr. 1999; pp. 725-731; vol. 17, No. 4., 7 pages.
Joshua R. Smith, et al.; "Electric Field Sensing for Graphical Interfaces"; IEEE Computer Graphics and Applications; May/Jun. 1998; pp. 54-60, 7 pages.
Jun Rekimoto et al., "PreSense: Interaction Techniques for Finger Sensing Input Devices," 2003, 10 pages.
Jun Rekimoto, "SmartSkin: An Infrastructure for Freehand Manipulation on Interactive Surfaces," CHI 2002, Apr. 20-25, 2002, 8 pages.
Ramjee Prasad and Tero Ojanpera, "An Overview of CDMA Evolution toward Wideband CDMA," IEEE Communications Surveys, vol. 1 No. 1, Fourth Quarter 1988, 28 pages.
Ken Hinckley and Mike Sinclair, "Touch-Sensing Input Devices," ACM CHI '99, Conf. on Human Factors in Computing Systems, 1999, 8 pages.
Paul Dietz and Darren Leigh, "DiamondTouch: A multi-user Touch Technology," ACM, Oct. 2003, 11 pages.
Quantum Research Group, QT240—4 Key Qtouch Sensor IC Datasheet, 2003, 12 pages.
Thomas G. Zimmerman et al., "Applying Electric Field Sensing to Human-Computer Interfaces," IEEE (SIG), May 1995, 8 pages.
William A.S. Buxton, "A Three-State Model of Graphical Input," Human-Computer Interaction—Interact '90, (1990), 11 pages.
Yamada, et al.; "A Switched-Capacitor Interface for Capacitive Pressure Sensors", IEEE Journal; Feb. 1992; pp. 81-86; vol. 41, No. 1., 6 pages.
Multicarrier CDMA with Adaptive Frequency Hopping for Mobile Radio Systems ("Chen"), Dec. 1996, 7 pages.
"Code Selection for CDMA Systems," Kimmo Kettunen, Licentiate Course on Signal Processing in Communications: 6, 8-10, 12 (e.g., claims 2 and 5 of '724), 1997, 14 pages.
Thomas V. Papakostas, Julian Lima, and Mark Lowe—"5.3: A Large Area Force Sensor for Smart Skin Applications"—IEEE—2002, 5 pages.
Quantum Research Group, QPROX™ QT310 Programmable Capacitance Sensor IC Datasheet, 2003, 20 pages.
Quantum Research Group, QProx™ QT60168, QT60248 16, 24 Key QMATRIX™ ICs Datasheet, 2004, 28 pages.
Philipp, Hal, "Charge-transfer Sensing-based Touch Controls Facilitate Creative Interfaces," ECN vol. 49 Issue 8, pp. 35-36, Jul. 2005, 3 pages.
Paul Michael Yarin, Toward the Distributed Visualization of Usage History, MIT Master of Science Thesis in 1999 (Degree not awarded) ("Yarin"), 66 pages.
E. A. Johnson, "Touch display—a novel input/output device for computers," Electronics Letters, vol. 1, Issue 8, p. 219-220 (Oct. 1965), 2 pages.
David Allport, Earl Rennison, and Lisa Strausfeld, "Issues of Gestural Navigation in Abstract Information Space" in CHI'95 Mosaic of Creativity, May 1995, 2 pages.
Cha—Class of ternary spreading—Elec Lett 636 (Cha), May 10, 2001, 2 pages.
"Flexible TouchSensor Chip Offers Simple, Independent Sensitivity Setting for up to 10 Keys," Business Wire, Aug. 18, 2005, 2 pages.

* cited by examiner

US 9,348,477 B2

METHODS AND SYSTEMS FOR DETECTING A POSITION-BASED ATTRIBUTE OF AN OBJECT USING DIGITAL CODES

PRIORITY DATA

This is a continuation of U.S. application Ser. No. 14/024,302 filed Sep. 11, 2013, which is a continuation of U.S. application Ser. No. 13/679,355 filed Nov. 16, 2012, which is a continuation of U.S. application Ser. No. 12/962,096, filed Dec. 7, 2010, which is a continuation of U.S. Pat. No. 7,868,874, issued Jan. 11, 2011, all of which are incorporated herein by reference.

FIELD OF THE INVENTION

The present invention generally relates to position or proximity sensors such as touchpads, and more particularly relates to devices, systems and methods capable of detecting a position-based attribute of a finger, stylus or other object using digital codes.

BACKGROUND

Position sensors are commonly used as input devices for computers, personal digital assistants (PDAs), media players, video game players, consumer electronics, wireless phones, payphones, point-of-sale terminals, automatic teller machines, kiosks and the like. One common type of sensor used in such applications is the touchpad sensor, which can be readily found, for example, as an input device on many notebook-type computers. A user generally operates the sensor by moving a finger, stylus or other stimulus near a sensing region of the sensor. The stimulus creates a capacitive, inductive or other electrical effect upon a carrier signal applied to the sensing region that can be detected and correlated to the position or proximity of the stimulus with respect to the sensing region. This positional information can in turn be used to move a cursor or other indicator on a display screen, scroll through text elements on the screen, or for any other user interface purpose. One example of a touchpad-type position sensor that is based on capacitive sensing technologies is described in U.S. Pat. No. 5,880,411, which issued to Gillespie et al. on Mar. 9, 1999.

While touchpad-type sensors have been in use for several years, engineers continue to seek design alternatives that reduce costs and/or improve sensor performance. In particular, significant attention has been paid in recent years to reducing the effects of noise generated by display screens, power sources, radio frequency interference and/or other sources outside of the sensor. Numerous sampling, filtering, signal processing, shielding, and other noise-reduction techniques have been implemented with varying levels of success.

Accordingly, it is desirable to provide systems and methods for quickly, effectively and efficiently detecting a position-based attribute of an object in the presence of noise. Other desirable features and characteristics will become apparent from the subsequent detailed description and the appended claims, taken in conjunction with the accompanying drawings and the foregoing technical field and background.

BRIEF SUMMARY

Methods, systems and devices are described for detecting a position-based attribute of a finger, stylus or other object with a touchpad or other sensor. According to various embodiments, the sensor includes a touch-sensitive region made up of any number of electrodes arranged in an appropriate fashion to detect user input. Modulation signals for one or more electrodes are produced as a function of any number of distinct discrete digital codes, which may be substantially orthogonal to each other. The modulation signals are applied to an associated at least one of the plurality of electrodes to obtain a resultant signal that is electrically affected by the position of the object. The resultant signal is demodulated using the plurality of distinct digital codes to discriminate electrical effects produced by the object. The position-based attribute of the object is then determined with respect to the plurality of electrodes from the electrical effects.

BRIEF DESCRIPTION OF THE DRAWINGS

Various aspects of the present invention will hereinafter be described in conjunction with the following drawing figures, wherein like numerals denote like elements.

DETAILED DESCRIPTION

Figure 1A:
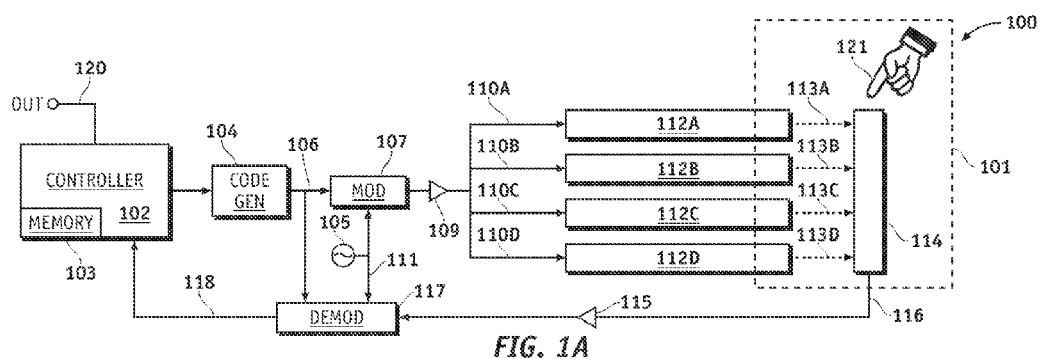
FIGS. 1A and 1B are block diagrams showing exemplary sensing devices.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, spread spectrum techniques can be applied within a position sensor such as a touchpad to improve noise immunity and/or to provide performance enhancements. Code division multiplexing (CDM), for example, can be used to create two or more distinct modulation signals that are applied to sensing electrode(s) within the sensor, thereby increasing the effective power of the applied signals. Coded spread spectrum modulation may refer to direct sequence, frequency hopping, time hopping or various hybrids of these or other techniques. Because the modulation frequencies applied to the sensitive region cover a wider spectrum than was previously received, narrow band noise occurring at a particular frequency or moderate wide band noise, uncorrelated with the coded modulation, has a minimal effect upon the narrower overall demodulated signal channels. The effect of noise on multiple signal channels may also be more uniform so that a minimum signal-to-noise ratio (SNR) is maintained for each useful signal channel. This concept can be exploited even further by selecting digital codes to produce frequency-domain signals that avoid known sources of noise. Spread spectrum techniques can therefore apply increased power to the sensing region while reducing the effects of noise, thereby resulting in a significantly improved SNR for the sensor in comparison to conventional time-domain multiplexing techniques of a comparable sample period. Spread spectrum techniques applied within the sensor may enable other beneficial sensor designs and features as well. These concepts are explored more fully below.

As used herein, the term "position sensor" is intended to encompass not only conventional touchpad devices, but also a broad range of equivalent devices that are capable of detecting the position or proximity of one or more fingers, pointers, styli or other objects. Such devices may include, without limitation, touch screens, touch pads, touch tablets, biometric authentication devices (e.g. fingerprint sensors), handwriting or character recognition devices, and the like. Similarly, the terms "position", "object position" and "position-based attribute" as used herein are intended to broadly encompass various types of absolute or relative positional or proximity information, and also other types of spatial-domain information such as speed, velocity, acceleration, and the like, including measurement of motion in one or more directions. Various position-based attributes may also include time history components, as in the case of gesture recognition and the like. Accordingly, many different types of "position sensors" may be capable of detecting widely varying "position-based attributes" beyond the mere presence or absence of an object in a wide array of alternate but equivalent embodiments determined by their applications.

Turning now to the drawing figures and with initial reference to FIG. 1A, an exemplary sensor 100 suitably includes a sensing region 101, a controller 102, a modulator 107, with associated drive circuitry 109, and a demodulator 117 with associated receiver circuitry 115 as appropriate. A position-based attribute of a finger, stylus or other object 121 is detected by applying various modulation signals 110A-D to electrodes 112A-D that, along with sensing electrode 114, define sensing region 101. The modulation signals 110A-D are capacitively or otherwise electrically coupled to one or more receiving electrodes 114, thereby forming any number of data transmission channels 113A-D. Electrical effects produced by object 121 upon channels 113A-D can be subsequently identified in signals 116 received by the receive electrode, and these received signals can be subsequently processed to isolate the location of object 121 with respect to electrodes 112A-D within sensing region 101. An example of a conventional technique for capacitively sensing and processing object position in a touchpad is set forth in U.S. Pat. No. 5,880,411, referenced above, although any other sensing techniques could be used in a wide array of alternate embodiments.

Figure 1B:
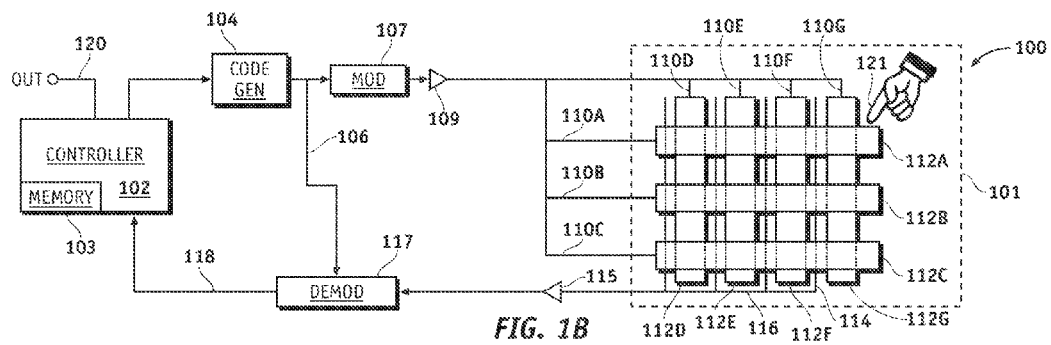

Although various types of sensors 100 are capable of detecting different electrical effects produced by object 121, the exemplary embodiments of FIGS. 1A-B show configurations for monitoring changes in capacitance across sensing region 101 caused by the presence or absence of object 121. More particularly, as modulation signals 110A-D are applied to electrodes 112A-D, a "virtual capacitor" is formed between each electrode 112A-D transmitting the modulated signal and a receiving electrode 114. If an object is present within the fields created by this capacitor, the capacitance between the transmitting electrode 112 and the receiving electrode 114 is affected. Typically, the effective capacitance between electrodes 112 and 114 is reduced if a grounded (or virtually grounded) object such as a finger is present, and the effective capacitance is increased if an ungrounded conductor (e.g. a stylus) or higher dielectric object is present. In either case, the change in capacitance caused by the presence of object 121 is reflected in the output signal 116 such as voltage, current, or charge measured from receive electrode 114.

By monitoring signals 116 produced by each modulation signal 110A-D, then, the presence of object 121 with respect to each electrode 112A-D (respectively) can be determined. In the exemplary embodiment shown in FIG. 1A, four sensing channels 113A-D are shown arranged in a one-dimensional sensing array 101. In the exemplary embodiment of FIG. 1B, seven channels 113A-G are implied with several channels 113A-C arranged in a first direction between 112A-C and 114, and the remaining channels 113D-G arranged in a substantially orthogonal direction between 112D-G and 114 to allow for detection of image "silhouettes" in two dimensions, as described more fully below with reference to FIG. 4. In practice, as few as one channel (e.g. a button) or as many as dozens, hundreds or even more sensing channels could be arranged in any single or multi-dimensional pattern in a wide array of alternate embodiments. Properly arranged, the position of an object 121 with respect to sensing region 101 can be determined from the electrical effects produced by object 121 upon the transmission of modulation signals 110A-D applied to the various electrodes. These effects, in turn, are reflected in the received signals 116 that are demodulated and subsequently processed as appropriate to arrive at output signal 120.

Further, sensor 100 may be readily configured or re-configured to create any type or number of sensing zones within region 101 by simply assigning or re-assigning digital codes used to create modulation signals 110. As shown in FIGS. 1A-B, each receiving electrode 114 may receive signals coupled by any number of signal channels 113, thereby resulting in multiple result signals 116 being provided on a single path. Because signals 116 are provided on a common path, sensing channels 113 of any number of electrodes may be created on a permanent or temporary basis by simply applying a common modulation signal 110 (e.g. a modulation signal 110 formed from a common digital code) to each of the transmit electrodes 112 making up the sensing zone. Sensing zones within region 101 may overlap and/or vary with time, and are readily re-configurable through simple application of different digital codes to one or more electrodes 112. More than one electrode may be part of a channel, and more than one channel modulation may be applied to an electrode.

In a traditional sensor, modulation signals 110A-D are typically simple sinusoidal or other periodic alternating current (AC) signals applied sequentially to the various channels using any form of time domain multiplexing (TDM). By applying spread spectrum concepts commonly associated with radio communications to sensor 100, however, numerous benefits can be realized. In particular, digital coding techniques similar to those used in code division multiple access (CDMA) radio communications can be employed to create distinct modulation signals 110A-D that can be simultaneously applied to the various sensing zones of region 101, thereby potentially reducing the switching complexity of sensor 100.

Spread spectrum techniques applied within sensor 100 may provide additional benefits, such as improved resistance to noise. Because each signal channel 113 results from the application of an appropriate digital code, for example, principles of code gain can be readily exploited to improve the performance of sensor 100. The gain of each modulation signal 110 applied to one or more transmit electrodes 112 increases with the length of the code. Through the use of conventional code generation techniques, combinatorial variations of the digital codes with well-known spectral and correlation properties are relatively easy to generate. Further, these combinatorial variations provide a relatively large pool of potential distinct digital codes from which to create modulation signals 110 with desirable time or frequency domain characteristics, as described below. Additional detail about particular code generation and signal processing techniques are described more fully below.

Again with reference to FIGS. 1A-B, sensing region 101 is any capacitive, resistive, inductive or other type of sensor that is capable of detecting the position, proximity and/or other position-based attribute of a finger, stylus or other object 121. Exemplary sensing regions 101 include the various sensors produced by Synaptics Inc. of Santa Clara, Calif., which appropriately detect a one dimensional, two dimensional or multi-dimensional position of an object 121 using capacitive or inductive coupling, although many other sensing regions 101 could be used in a wide array of alternate embodiments. Other types of sensing regions 101 capable of detecting position or proximity include sensors based upon acoustic, optical, or electromagnetic properties (e.g. radio frequency, infrared, ultraviolet or the like), and/or any other effects.

Controller 102 is any processor, microcontroller, neural network, analog computer, programmed circuitry, or other module capable of processing input data 118 to extract output indicia 120 and/or the like. The particular control circuitry 102 used varies widely from embodiment to embodiment, but in exemplary embodiments controller 102 is a model T1004, T1005, T10XX or other microcontroller produced by Synaptics Inc. of Santa Clara, Calif. In many embodiments, controller 102 includes and/or communicates with a digital memory 103 that suitably stores digital instructions in any software or firmware form that are executable by controller 102 to implement the various sensing, control and other functions described herein. Alternatively, the functions of memory 103 may be incorporated into controller 102 such that a physically distinct memory device 103 may not be present in all embodiments. The physical controller may also incorporate more elements including the drive circuitry 109 and receive circuitry 115, as well as, others described.

Code generation module 104 is any discrete or integrated circuit, device, module, programming logic and/or the like capable of producing digital codes 106 that can be used in generating modulation signals 110A-D. The number, size and types of digital codes produced vary significantly, but in various embodiments the codes are substantially orthogonal to each other, and are of sufficient length to provide for enough distinct digital codes to be associated with each sensing zone of region 101. The discrete codes may be binary, ternary, or generically multi-level, and may indicate both driven and un-driven states (tri-state). Various circuits, modules and techniques for generating digital codes suitable for use with CDM include shift register sequences such as Walsh-Hadamard codes, m-sequences, Gold codes, Kasami codes, Barker codes, delay line multiple tap sequences, and/or the like. Alternatively, digital codes may be pre-determined and stored in a lookup table or other data structure within controller 102 and/or memory 103, and/or may be generated by controller 102 using any suitable algorithm. In such embodiments, code generation module 104 may not be present as a separate physical element from controller 102, but rather should be considered to be a logical module representing the code generation and/or retrieval function carried out by controller 102 or other digital processing devices as appropriate.

The term "substantially orthogonal" in the context of the distinct digital codes is intended to convey that the distinct codes need not be perfectly orthogonal from each other in the mathematical sense, so long as the distinct codes are able to produce meaningful independent results. Strict orthogonality may thus be traded off for various other properties such as correlation, spectra, or compressibility. Similarly, the term "sensing zone" is intended to convey that a single code could be applied to multiple electrodes 112 to create a single zone of sensitivity that encompasses a larger portion of sensing region 101 than any of the individual electrodes 112. Also, more than one code could be applied to an electrode creating overlapping or spatially filtered "sensing zones". For example phase delayed or "shifted" versions of the same code sequence can be distinct and substantially orthogonal such that they are readily distinguishable. In various cases, interpolation between phase shifts may even be possible.

Modulator 107 is any circuit, logic or other module capable of producing modulation signals 110A-D using the distinct digital codes produced by module 104. Typically, modulator 107 modulates a carrier signal 111 with the digital codes 106 using any type of amplitude modulation (AM), frequency modulation (FM), phase modulation (PM) or another suitable technique to create modulation signals 110A-D. Accordingly, modulator 107 may be implemented using any conventional digital and/or analog circuitry, or may be partially or entirely implemented with software logic executing within controller 102 or the like. Carrier signal 111 may be produced by any oscillator or other signal generator 105 as appropriate. In one embodiment suitable for use in a capacitively-sensing touchpad, signal 111 can be produced at frequencies that range from about 10 kHz-100 MHz, although these signals may be produced at any frequency or range in a wide array of equivalent embodiments. Additional detail about an exemplary modulation function is described below with respect to FIG. 3. In still other embodiments, carrier signal 111 is eliminated and spectral components of the applied modulation signals 110A-D are determined from the clock rate, repeat lengths and/or other aspects of the digital codes. The carrier signal 111 may therefore be eliminated and/or conceptualized as a direct current (DC) signal in various alternate embodiments.

Modulation signals 110A-D are applied to electrodes 112A-D of sensing region 101 in any manner. In various embodiments, modulator 107 suitably applies the signals to the appropriate electrodes 112A-D via any drive circuitry 109, which includes any sort of scaling amplifier, multiplexer, switch to any current or voltage source, charge transfer device, controlled impedance, and/or the like. FIG. 1A shows a plurality of signal paths 109A-109D coupling the modulator 107 to corresponding transmitter electrodes 112A-112D. Alternatively, a single driver circuit 109 may be used to interconnect modulator 107 and sensing region 101 in a serial fashion, although in practice drive circuitry 109 will typically include multiple amplifiers, multiple drivers and/or other signal paths providing parallel connections between modulator 107 and the various electrodes 112 within sensing region 101 to permit multiple sensing channels 113 to be driven by modulated electrodes 112 simultaneously with the same or different signals.

As noted above, modulation signals 110A-D are provided to electrodes 112A-D in sensing region 101, and resultant signals 116 from receiving electrode 114 are provided to a suitable demodulator 117. A scaling amplifier, multiplexer, filter, discriminator, comparator, and/or other receiving circuitry 115 may be provided as well to shape received signals 116. Demodulator 117 is any circuit or other module capable of demodulating the output 116 of sensing region 101 to identify any electrical effects produced by object 121. Demodulator 117 may also include and/or communicate with a demodulation filter, such as any suitable digital or analog low-pass or band-pass filter, as well as any conventional analog-to-digital converter (ADC). In various embodiments, demodulator 117 receives carrier signal 111 and/or the phase shifted versions of the distinct digital codes 106 to allow demodulation of both signals. Alternatively, demodulator 117 provides analog demodulation of carrier signal 111 and provides the resultant signals to controller 102 and/or receiving circuitry 115 for subsequent processing. Similarly, the demodulation function represented by module 117 in FIG. 1 may be logically provided in hardware, software, firmware and/or the like within controller 102 and/or another component, thereby removing the need for a separately-identifiable demodulation circuit 117.

During the operation of sensor 100, any number of distinct digital codes are produced by code generation module 104 and modulated with a carrier frequency to create a set of modulation signals 110A-D applied to any number of electrodes 112A-D within sensing region 101. The position of object 121 with respect to sensing region 101 electrically affects one or more output signals 116 provided from sensing region 101. By demodulating the resultant signals 116, the electrical effects can be identified and subsequently processed by controller 102 or the like to determine a position-based attribute relating to object 121. By modulating the electrodes with an appropriate digital code, the narrower sensing frequency for the sensor is effectively spread across multiple frequencies, thereby improving noise rejection. Moreover, the use of code division multiplexing allows each of the modulation signals 110A-D to be applied simultaneously, thereby reducing or eliminating the need for separate time domain switching and control in many embodiments. The electrical effects identified from sensing region 101 using spread spectrum techniques may be further processed by controller 102 and/or another processing device as appropriate.

Figure 2:
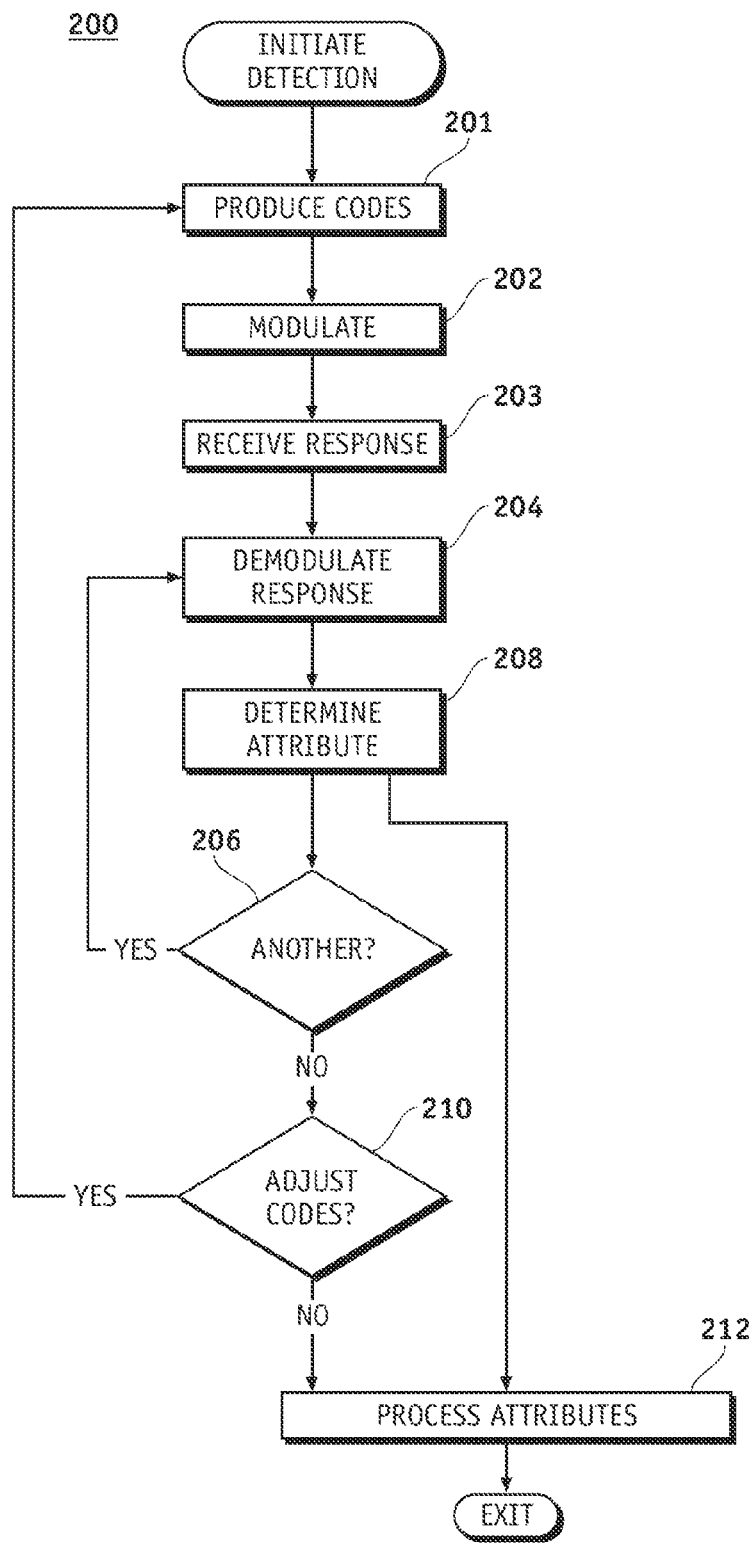
FIG. 2 is a flowchart showing an exemplary process for detecting a position-based attribute of an object.

With reference now to FIG. 2, an exemplary process 200 for detecting a position-based attribute of an object with respect to a sensing region 101 suitably includes the broad steps of producing a set of distinct digital codes for modulation signals 110A-D (step 201), demodulating each of the response signals 116 that result from the application of modulation signals 110A-D (steps 204, 206), and determining one or more position-based attributes of object 121 from the electrical effects identified within the response signals 116 (step 208). In various further embodiments, the particular digital codes generated in step 201 may be modified (step 210) to reduce the effects of noise, reducing interference on other devices caused by this device, or for any other purpose. Additional processing may also be performed (step 212), such as single or multi-object processing, rejection of undesired image data, and/or the like.

Although the flowchart shown in FIG. 2 is intended to show the various logical steps included in an exemplary process 200 rather than a literal software implementation, some or all of the steps in process 200 may be stored in memory 103 and executed by controller 102 alone and/or in conjunction with other components of sensor 100 (e.g. code generation module 104, modulator 107, demodulator 117 and/or the like). The various steps may be alternately stored within any digital storage medium, including any digital memory, transportable media (e.g. compact disk, floppy disk, portable memory and/or the like), magnetic or optical media, and/or the like. The various steps of process 200 may be applied in any temporal order, or may be otherwise altered in any manner across a wide array of alternate embodiments. Further, the various steps shown in FIG. 2 could be combined or otherwise differently organized in any manner.

As noted above, the distinct digital codes 106 used to create modulation signals 110A-D may be produced in any manner (step 201), such as by any type of hardware or software logic represented by code generation module 104 in FIG. 1. Any number of feedback shift registers, for example, can be configured in a maximum length sequence (MLS) or the like to generate a pseudo-random digital code of any desired length that could be readily applied in a variety of phases and/or sums as distinct code sequences to the various modulation signals 110A-D. The resulting sequence of binary codes 106 emanating from parallel shift registers is generally spectrally flat, with the exception of a minimal DC term. In an alternate embodiment, a MLS or other routine for generating digital codes 106 may be simulated in software executing within controller 102, or elsewhere as appropriate. In still other embodiments, codes 106 are generated prior to use and stored in a lookup table or other data structure in memory 103, or the like. In various alternate but equivalent embodiments, controller 102 may directly generate or retrieve codes 106 and/or may produce them by directing the operation of a separate code generation module 104 or the like. As noted above, the particular codes may be generated in any manner. A digital bit sequence may be simply shifted in phase, for example, to create multiple distinct codes. Alternatively, distinct codes can be computed from other codes using a variety of methods including summation, exclusive-or, and multiplication, and/or other techniques of generating high dimensionality random and pseudo-random sequences. Code generation techniques based upon exclusive-or or multiplication operations may provide an additional benefit of generating linear combinations that may be useful in some embodiments.

The various codes 106 are then used to modulate or otherwise create the particular modulation signals 110A-D that are applied to the various sensing electrodes 112A-D in sensing region 101 (step 202). As described above, the applied signals are electrically affected by the presence of object 121, with the resultant electrical effects being determinable from received signal 116 (step 203).

Demodulating received signal channels 113 (in step 204) suitably involves extracting information about the position of object 121 from the modulated signals. Such extraction typically involves reversing the modulation process described above. Accordingly, demodulator 117 typically receives carrier signal 111 (or another signal that is synchronous with signal 111) for performing analog demodulation and/or signal discrimination (e.g. distinguishing between noise and desired signal) in addition to the particular digital code 106 that previously modulated the carrier signal used to create the particular resultant signal 116. Because the sensor both transmits and receives, it is rarely necessary to recover the carrier or code sequence.

Demodulation may be carried out for any number of received signal channels 113, as appropriate (step 206). In the exemplary sensor 100 shown in FIG. 1A, signal 116 resulting from the transmission of each signal channel from the modulated electrodes 112A-D are received on a common path emanating from receiving electrode 114. Even if the various sensing channels 113A-D are all active at the same time (e.g. modulation signals 110A-D are simultaneously provided to each modulated electrode 112A-D), however, the resulting signals 116 produced by each channel 113A-D can be demodulated using conventional CDM demodulation techniques. Particular components (or channels) of resultant signal 116 produced in response to any modulation signal 110A-D can therefore be readily extracted. This concept can be exploited in myriad ways, as described below, to create a number of additional features and performance enhancements within sensor 100. A common modulation signal 110A-D, for example, could be applied to multiple electrodes 112A-D to increase the size of any particular sensing zone within region 101. These zones can be readily adjusted during operation to create various operating modes or the like. To make the entire sensing region 101 act as a single button, for example, each electrode 112A-D could be provided with the same modulation signal 110 without otherwise adjusting the performance of the sensor. Because all of the signals resulting from receive electrode 116 are provided on a common path in FIG. 1, simply demodulating the entire received signal using the common modulation code will identify the presence of object 121 anywhere within sensing region 101 in this case. Similar concepts can be applied to create any number of independent or overlapping sensing zones across sensing region 101 through simple manipulation of digital code sequences 106. Furthermore, spatial frequency filtering can be done simply through proper modulation and demodulation, for example to accomplish palm rejection or to reject other inappropriate inputs.

The demodulated signals 118 are appropriately received at controller 102 so that the position-based attribute of object 121 can be determined (step 208). These signals may be filtered digitally or as analog, using linear and non-linear filters. Various techniques for identifying the position of object 121 with respect to the various electrodes 112A-D include detection of peak electrical effect, computation of a centroid based upon the electrical effects, comparison of differences in electrical effects observed between electrodes 112A-D, comparison of changes in electrical effects over time, interpolation between signal channels from the electrodes, and/or according to many other techniques. In the case of peak detection, the position of object 121 is associated with one or more electrodes 112A-D by identifying which modulation signal 110A-D produced the greatest relative change of capacitive effect in resultant signal 116. Sensing channels 113A-D experiencing such peak (maximum, minimum, or otherwise distinct) electrical effects could also be identified by comparing currently-observed, scaled electrical effects to baseline values (e.g. average values for the particular channel that are empirically determined, averaged over time, stored from a previous observation, and/or the like). Still other embodiments could identify the channel 113A-D that produced peak electrical effects by comparing current electrical effects for each channel 113A-D with current values observed in neighboring sensing channels. Alternatively, a weighted average of the electrical effects observed from some or all of the modulated electrodes 112A-D can be computed, with this weighted average, or centroid, correlating to the position of object 121. Many techniques for correlating electrical effects observed across sensing region 101 to a position of object 121 are known or may be subsequently developed, and any of these techniques may be used in various embodiments, according to the application.

By varying the digital codes 106 used to create modulation signals 110A-D over time, various additional features can be implemented. To implement a simple dual-differential digital-to-analog conversion for received signal channels 113, for example, the digital code 106 applied to one or more electrodes 112 is logically inverted (e.g. 1's complement) on a periodic, aperiodic, or other time basis to obtain complementary sensed signals 116. The complementary codes 106 can be used to drive two separate ADC inputs (e.g. ADCs present in driver 115 and/or demodulator 117) in opposite directions, thereby canceling out many types of variability or residual distortion in signal 116. Steps 210 and 212 describe optional noise reconfiguration and image processing features, respectively, that may be enabled in various embodiments as additional benefits available from the use of spread spectrum techniques. These features are described in increasing detail below (in conjunction with FIGS. 3 and 4, respectively), and may not be present within all embodiments. Because the digital codes 106 are inherently simple to modify, store and subsequently process, any number of signal enhancement, noise reduction and/or other performance improvements to sensor 100 are enabled. Further, a relatively large number of digital codes are available due to the combinatorial power of digital sequences. Coding gain and orthogonality conventionally rely upon linearity and superposition of the particular codes used. Although non-linearity and dispersion limit the theoretical effectiveness of digital codes, these limitations can be more than offset by the increases in relative signal power (and thus SNR) that can result from simultaneously modulating more than one electrode 112. Further, since it is possible that self-induced inter-channel noise dominates over other noise sources in many embodiments, a relatively stable dynamic range can be provided.

Figure 3:
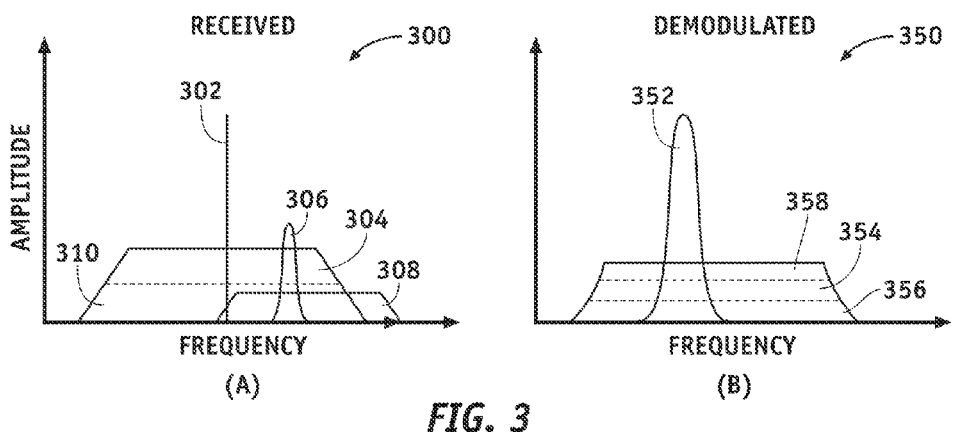
FIG. 3 includes two frequency domain plots for exemplary received and demodulated signals.

Referring now to FIGS. 3A-B, spread spectrum techniques allow for improved noise avoidance as compared to conventional single-frequency sampling techniques. As noted above, a sensing zone may correspond to a single electrode 112, or a common modulation signal 110 may be provided to multiple electrodes 112 to create a larger sensing zone that effectively behaves as a single "electrode" for purposes of subsequent demodulation and computation. The modulated waveform 110, being the function of a distinct digital code 106, uniquely identifies the sensing zone to which it is applied, thereby allowing ready application of CDM and other conventional spread-spectrum techniques. FIG. 3 shows an exemplary spectral plot 300 that emphasizes the frequency domain differences between the spectrum 302 of carrier signal 111 and the spectrum 304 of modulated signal 110. In contrast to a single-frequency carrier signal 302, the multi-frequency spectrum 304 of modulated signal received on 114 is much wider. Because the spectrum 304 of the modulated signal distributes available power across a much wider sensitivity band, the effects of narrowband noise signals 306 at or near any particular frequency of interest are significantly reduced. That is, if a spurious noise signal 306 happened to occur near a single-frequency (or narrowband) carrier signal 302, any electrical effects present within the sensing channel 113 could be overwhelmed by the noise. Moreover, adverse effects of wider-band noise 308 or interference from other modulated electrode channels 310 can be mitigated through spread-spectrum techniques, as shown in spectral plot 350 of received signal 116. Plot 350 shows that the demodulated signal 352 (corresponding to coupling of a channel 113 and/or the presence of object 121 near the demodulated sensing region) is contained within a relatively narrow frequency band, whereas signals 354 received from other channels are spread across a wider band. Both wideband noise 308 and narrow band noise 306 are similarly spread across wider frequency bands 356 and 358 in the demodulated signal. By increasing the bandwidth of the applied modulated signal 110, then, the signal-to-noise ratio in the demodulated signal 116 is improved dramatically. The demodulation in turn spreads the noise outside of the signal band, which then becomes quite narrow, thereby allowing the desired signal portion 352 to be readily extracted by a narrow band filter or the like. This concept can be further exploited by selecting digital codes 106 that avoid known sources of noise. That is, digital codes 106 of any bit length may be applied to carrier signal 111 to create spectral "gaps" at frequencies known to be susceptible to spurious noise. By applying conventional Fourier analysis (e.g. using a simple fast Fourier transform (FFT) or the like), digital codes can be selected to create modulation signals 110 having many desired spectral characteristics. Codes applied to any modulated electrode 112 can be modified during operation (e.g. step 210 in FIG. 2) and/or may be pre-selected to avoid expected or observed noise in resultant signals 116. Alternatively, the particular codes 106 applied to one or more electrodes 112 may be randomly, pseudo-randomly, deterministically or otherwise modified during sensor operation, thereby statistically filtering any noise present within resultant signals 116 or demodulated signals 118 over time. Similarly, particular spatial frequencies or spatial positions can be emphasized (e.g. with code gain) or filtered out by the codes applied to different modulation electrodes. Code shifting during operation may provide other benefits (e.g. discrimination of or resilience to moisture) in addition to reducing the effects of noise or spurious effects of non-input objects (palm etc). In various equivalent embodiments, the frequency, phase, amplitude and/or waveform of carrier signal 111 may be adjusted in place of or in addition to modifying digital codes 106.

Figure 4:
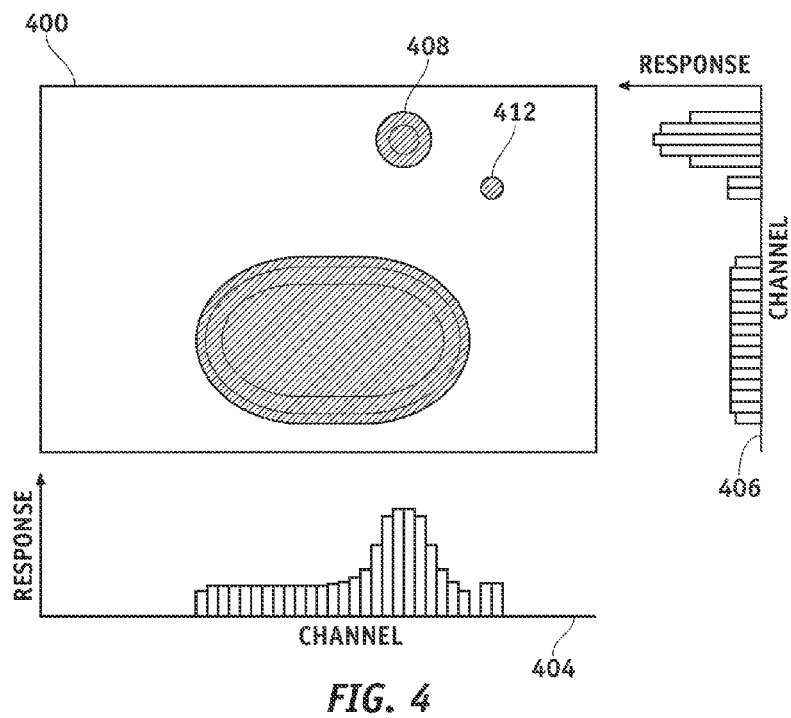
FIG. 4 is a depiction of an exemplary scenario for processing electrical images of sensed objects.

With reference now to FIG. 4, spread spectrum techniques that simultaneously apply multiple coded modulation signals 110A-D to various electrodes 112A-D are able to identify multiple presences 408, 410, 412 of objects 121 located within sensing region 101. Multiple objects may correspond to the presence of multiple fingers on a touchpad, for example, a palm resting on sensor 100 during use, simultaneous presence of a finger and a stylus, and/or any other combination of inputs. Electrical effects resulting from the various presences 408, 410, 412 can be conceptually projected along one or more axes 404, 406 to identify the relative positions of the objects along that axis, as shown in FIG. 4. That is, peak value(s) of electrical effects can be correlated to relative positions of objects 121 with respect to sensing region 101. In the example of FIG. 4, a finger 408 may be identified by increases in electrical effects projected along an "X" axis 404 and a "Y" axis 406. By correlating the relative X and Y positions of peak electrical effects, the location of presence 408 can be correlated in two dimensions (or any other number of dimensions). Similarly, the example of FIG. 4A shows a larger area indicating a second presence 410 that results in projections of electrical effects in axes 404 and 406. These multiple projections of electrical effects can be additionally correlated to identify images (e.g. "outlines") of objects 121 present within region 101. Taking this concept further, one or more images 408, 410, 412 may be subsequently processed as appropriate. Presence of multiple fingers within region 101 may be used to perform scrolling, mode selection or other tasks, for example. Similarly, if an image can be identified as resulting from a user's palm (or another undesired portion of the user's body), that image 410 can be subsequently rejected in future processing, such as reporting of positional information or other output signals.

Figure 5:
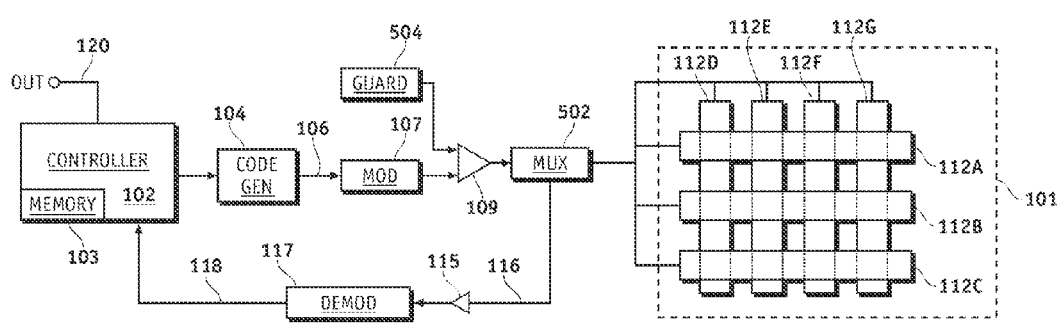
FIG. 5 is a block diagram of an exemplary sensing device capable of sensing multiple position-based attributes in two dimensions.

In the exemplary embodiment shown in FIG. 4, the two axes 404, 406 generally correspond to portions of modulated electrodes 112 or their associated channels shown arranged in two approximately orthogonal directions as in FIG. 1B. Alternate embodiments, however, may include any number of electrodes 112 arranged in any overlapping, non-overlapping, matrix or other arrangement. An example of a sensor 500 with overlapping electrodes 112A-G arranged in two dimensions is shown in FIG. 5. In such embodiments, electrical effects on received channels can effectively be independently measured at each crossing of the electrodes in two directions (e.g. X and Y directions corresponding to axes of 404, 406 in contour plot 400), with the results correlated in controller 102 to provide a two-dimensional representation or image of object 121 rather than two one-dimensional "silhouettes" like 404 and 406. In such cases, electrodes arranged in the first direction (e.g. electrodes 112A-C) may be modulated at separate times from electrodes arranged in the second direction (e.g. electrodes 112D-G), with one or more independent received signals 116 at any one time from either set of electrodes (e.g. electrodes 112D&F) being provided to demodulator 117 via a multiplexer 502. FIG. 5 shows the various electrodes 112A-G coupled to both modulator 107 and demodulator 117 via a multiplexer 502. The multiplexer may also connect one or more of the electrodes to receiving circuitry 115 before demodulation. In practice, each electrode may be connected in any manner to allow signals to be applied on one subset of electrodes 112 and received on another subset.

In various embodiments, two or more electrodes which serve to receive channels (e.g. analogous to channel 113 described above) may be provided with independent resultant signals 116. Further, inactive or unused electrodes (e.g. 112E&G may be coupled to an electrical reference (e.g. ground) or driven with a modulated signal to improve spatial resolution on the active receive channels. This reference is commonly referenced as a shield or guard signal, which may be applied via multiplexing logic 502 or the like.

Figure 6A:
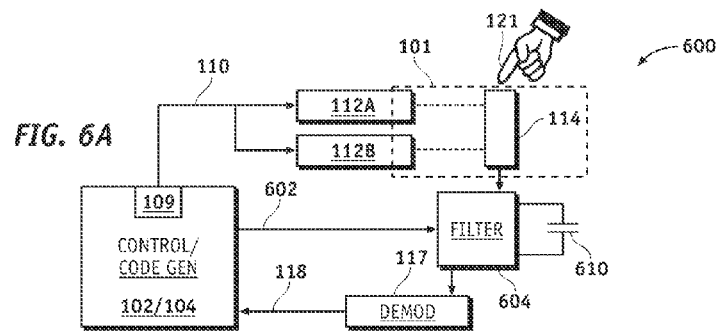
FIGS. 6A and 6B includes two block diagrams of exemplary sensing devices with a filtering capacitor: one with simultaneous sensing of multiple signal channels on a common receive electrode, and the other with unified modulation and receive electrodes.

Digital coding and other spread-spectrum techniques may be equivalently applied in sensors that operate in any number of different manners. FIG. 6A, for example, shows an exemplary sensor 600 that includes any number of modulated electrodes 112A-B arranged in any single or multi-dimensional fashion that are coupled to a capacitive filter circuit 604 (which may include an integrating capacitor 610) which linearly transforms the charge transferred by the modulated electrodes. A microcontroller 102/104 or the like suitably generates distinct digital codes 106 that modulate the transmitter electrodes 112A-B which are capacitively coupled to the one or more receiver electrodes 114 as described above. In this case, however, the digital codes 106 are not necessarily intended to encode the voltage provided to each electrode 112A-B, but rather to control the timing of charge that is transferred to receiver electrode 114. By controlling the timing of each electrode's charging and discharging and then observing the amount of charge collected at integrating capacitor 610 from receiver electrode 114, the amount of charge provided by each electrode 112A-B can be determined from the demodulated signal 118. The charging of each electrode 112A-B can be controlled by selecting digital codes 106 such that voltage is applied to each electrode only when charge should be transferred to the receiving electrode 114, and otherwise allowing it to float. By selectively providing charge from individual and/or groups of electrodes 112A-B to capacitor 610, the amount of coupling from each electrode 112A-B (which is affected by the proximity of an object 121) can be determined.

Figure 6B:
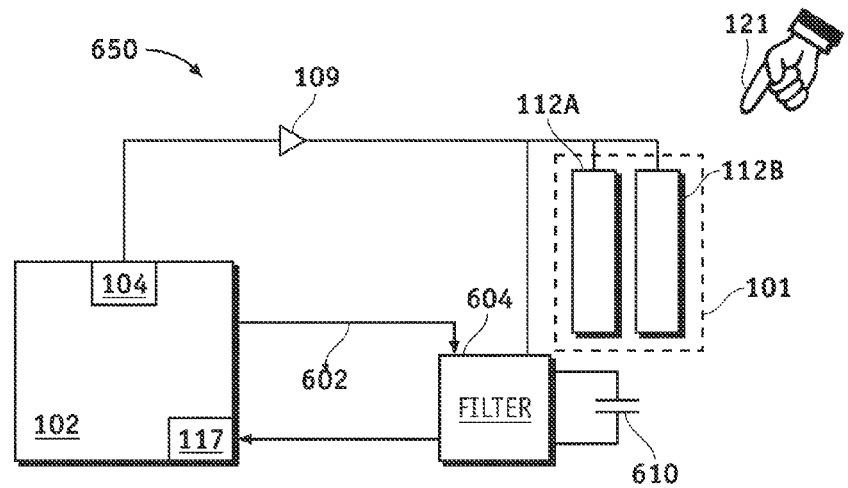

FIG. 6B presents an alternate embodiment of an exemplary sensor that has unified sensing and driving on each electrode 112 that is filtered or demodulated by one or more capacitors 610. The codes 106 modulate drive circuitry 109, which may be implemented as a current source connected to the electrodes 112. The response of the electrode to the drive circuitry is affected by the coupling of an object 121 near the electrode, and the resultant signals (e.g. the voltage resulting from the coupling) are filtered and/or demodulated by the circuit 604 and capacitor 610. The filtered signals may be further demodulated to determine position attributes of the object. Further, more than one electrode could be simultaneously driven with substantially orthogonal codes and after demodulation a stable coupling of one electrode 112A to another electrode 112B would substantially cancel out. These and many other position sensing methods benefit from digital coding and spread spectrum techniques.

Figure 7:
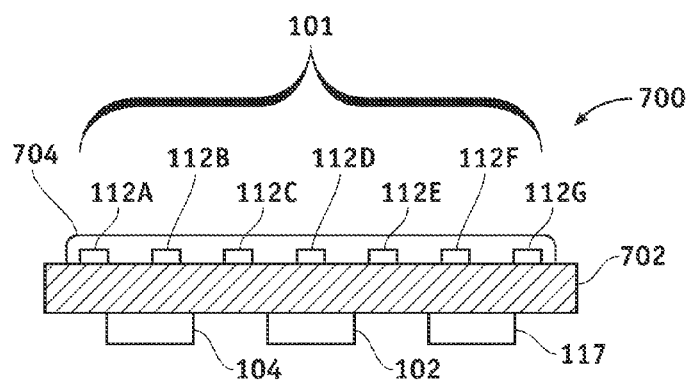
FIG. 7 is a block diagram of an exemplary sensing device formed on a single substrate.
Figure 8:
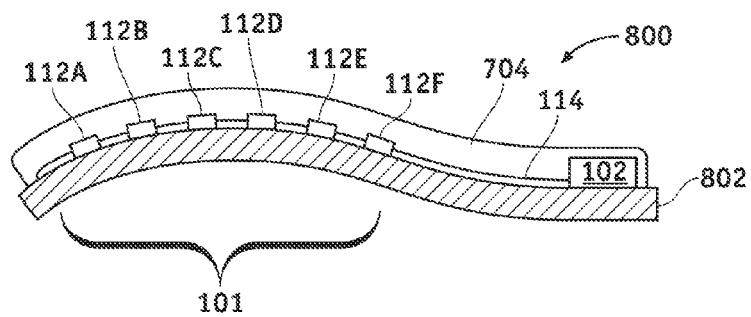
FIG. 8 is a block diagram of an exemplary sensing device formed on a flexible substrate.

With reference now to FIG. 7, various sensors 700 formed in accordance with the coding techniques described herein may be formed on a single circuit board or other substrate 702. In such embodiments, electrodes 112A-G forming sensing region 101 may be disposed on one side of the substrate, with the processing components (e.g. controller 102 and the like) formed on the opposite side. Because various sensors (e.g. sensors 100 and 500 shown in FIGS. 1 and 5) do not require physical movement of sensing and receiving electrodes 112, 114 with respect to each other, electrodes 112, 114 in such sensors may be rigidly fixed on substrate 702 in any manner. Substrate 702 can be made of a flexible material to allow for folding or bending. Further, a protective surface 704 may be deposited or otherwise placed over the electrodes to provide consistent dielectric isolation and to protect against moisture, dust and other environmental effects. Surface 704 may also provide tactile feedback to the user as appropriate. FIG. 8 shows an exemplary sensor 800 is formed on a flexible substrate 802 as appropriate. FIG. 8 also shows that the various processing components may be found on the same side of substrate 802 as the modulated and sensing electrodes, and that the substrate 802 may also provide tactile feedback for region 101. It should be appreciated that the various concepts, structures, components and techniques described herein may be inter-combined and/or modified as appropriate to create a wide variety of alternate embodiments.

Accordingly, there are provided numerous systems, devices and processes for detecting a position-based attribute of a finger, stylus or other object in a position sensing device such as a touchpad. While at least one exemplary embodiment has been presented in the foregoing detailed description, it should be appreciated that a vast number of variations exist. The various steps of the techniques described herein, for example, may be practiced in any temporal order, and are not limited to the order presented and/or claimed herein. It should also be appreciated that the exemplary embodiments described herein are only examples, and are not intended to limit the scope, applicability, or configuration of the invention in any way. Various changes can therefore be made in the function and arrangement of elements without departing from the scope of the invention as set forth in the appended claims and the legal equivalents thereof.

What is claimed is:

1. A method of capacitive sensing with a position sensor, the method comprising:
   simultaneously transmitting a first modulation signal with a first transmit electrode and a second modulation signal with a second transmit electrode, wherein the first and modulation signal and the second modulation signal are distinct modulation signals based on different distinct digital codes of a plurality of distinct digital codes and a carrier signal, and further wherein at least one distinct digital code of the plurality of distinct digital codes indicates driven and un-driven states;
   receiving a resultant signal from a receive electrode, wherein the resultant signal comprises electrical effects associated with the first modulation signal and the second modulation signal; and
   determining a first position of a first object and a second position of a second object based on the electrical effects resultant.

2. The method of claim 1 wherein each of the plurality of distinct digital codes comprises a code selected from the set of codes consisting of: binary codes and ternary codes.

3. The method of claim 1 wherein the simultaneously transmitting the first modulation signal with the first transmit electrode and the second modulation signal with the second transmit electrode comprises modulating at least one characteristic of the carrier signal, the modulating the at least one characteristic the carrier signal selected from the group consisting of:
   frequency modulating the carrier signal according to the different distinct digital codes of the plurality of distinct digital codes;
   amplitude modulating the carrier signal according to the different distinct digital codes of the plurality of distinct digital codes; and
   phase modulating the carrier signal according to the different distinct digital codes of the plurality of distinct digital codes.

4. The method of claim 1, wherein each distinct digital code of the plurality of distinct digital codes is mathematically independent from all other distinct digital code of the plurality of distinct digital codes.

5. The method of claim 1, wherein each of the plurality of distinct digital codes comprises a code selected from the group consisting of Walsh-Hadamard codes, Gold codes, Kasami Codes, Barker Codes and Pseudo-Random Digital Codes.

6. The method of claim 1, wherein the first position comprises a position of the first object with respect to a sensing region of the position sensor.

7. A controller for a capacitive position sensor, the controller comprising:
   drive circuitry configured to simultaneously apply a first modulation signal to a first transmit electrode and a second modulation signal to a second transmit electrode, wherein the first modulation signal and the second modulation signal are distinct signals based on different distinct digital codes of a plurality of distinct digital codes and a carrier signal, and further wherein at least one distinct digital code of the plurality of distinct digital codes indicates driven and un-driven states; and
   receive circuitry configured to receive a resultant signal from a receive electrode, the resultant signal comprising electrical effects associated with the first modulation signal and the second modulation signal;
   wherein the controller is configured to determine a first position of a first object and a second position of a second object based on the electrical effects.

8. The controller of claim 7, wherein the plurality of distinct digital codes comprise a code selected from the set of codes consisting of: binary codes and ternary codes.

9. The controller of claim 7, wherein the drive circuitry is configured to simultaneously apply the first modulation signal to the first transmit electrode and the second modulation signal to the second transmit electrode by modulating at least one characteristic of the carrier signal, the modulating the at least one characteristic the carrier signal selected from the group consisting of:
   frequency modulating the carrier signal according to the different distinct digital codes of the plurality of distinct digital codes;
   amplitude modulating the carrier signal according to the different distinct digital codes of the plurality of distinct digital codes; and phase modulating the carrier signal according to the different distinct digital codes of the plurality of distinct digital codes.

10. The controller of claim 7, wherein each distinct digital code of the plurality of distinct digital codes is mathematically independent from all other distinct digital code of the plurality of distinct digital codes.

11. The controller of claim 7, wherein each of the plurality of distinct digital codes comprises a code selected from the group consisting of Walsh-Hadamard codes, Gold codes, Kasami Codes, and Barker Codes.

12. The controller of claim 7, wherein the plurality of distinct digital codes comprises a Pseudo-Random codes.

13. The controller of claim 7, wherein the controller is further configured to generate the plurality of distinct digital codes by shifting a digital bit sequence.

14. The controller of claim 7, wherein the controller is further configured to demodulate the resultant signal to remove effects of the carrier signal and the effects of the plurality of distinct digital codes to thereby discriminate electrical effects produced by the first object and the second object.

15. The controller of claim 7, wherein the controller is further configured to adjust a frequency of the carrier signal in response to electrical noise.

16. A capacitive position sensor comprising:
a plurality of transmit electrodes;
a plurality of receive electrodes; and
a controller coupled to the plurality of transmit electrodes and to the plurality of receive electrodes and configured to:
simultaneously apply a first modulation signal to a first transmit electrode and a second modulation signal to a second transmit electrode, wherein the first modulation signal and the second modulation signal are distinct modulation signals based different distinct digital codes of a plurality of distinct digital codes and a carrier signal, and further wherein at least one of the plurality of distinct digital codes indicates driven and un-driven states;
receiving resultant signals from the plurality of receive electrodes, wherein the resultant signals comprise electrical effects associated with the first modulation signal and the second modulation signal; and
determining a first position-based attribute of a first object and a second position-based attribute of a second object based on the electrical effects.

17. The position sensor of claim 16, wherein each distinct digital code of the plurality of distinct digital codes is mathematically independent fromt the other distinct digital code of the plurality of distinct digital codes.

18. The position sensor of claim 16, wherein each of the plurality of distinct digital codes comprises a code selected from the set consisting of: binary codes and ternary codes.

19. The position sensor of claim 16, wherein the controller is configured to simultaneously apply the first modulation signal to the first transmit electrode and the second modulation signal to the second transmit electrode by modulating at least one characteristic of the carrier signal, the modulating the at least one characteristic the carrier signal selected from the group consisting of:
frequency modulating the carrier signal according to the different distinct digital codes of the plurality of distinct digital codes;
amplitude modulating the carrier signal according to the different distinct digital codes of the plurality of distinct digital codes; and
phase modulating the carrier signal according to the different distinct digital codes of the plurality of distinct digital codes.

20. The position sensor of claim 16, wherein each of the distinct digital codes comprises a code selected from the group consisting of Walsh-Hadamard codes, Gold codes, Kasami Codes, Barker Codes and Pseudo-Random codes.

21. The position sensor of claim 16, wherein the controller is further configured to generate the plurality of distinct digital codes by shifting a digital bit sequence.

22. The position sensor of claim 16, wherein the plurality of transmit electrodes is disposed in a first direction and the plurality of receive electrodes is disposed in a second direction substantially orthogonal to the first direction.

23. The position sensor of claim 16, wherein the controller is further configured to determine at least a partial image for an input object interacting with the position sensor.

24. A controller for a capacitive position sensor, the controller comprising:
drive circuitry configured to simultaneously apply a first modulation signal to a first transmit electrode and a second modulation signal to a second transmit electrode, wherein the first modulation signal comprises a carrier signal modulated according to a first distinct digital code of a plurality of distinct digital codes and the second modulation signal comprises the carrier signal modulated according to a second distinct digital code of the plurality of distinct digital codes; and
receive circuitry configured to receive a plurality of resultant signals from a plurality of receive electrodes, a first resultant signal of the plurality of resultant signals comprising first electrical effects associated with the first modulation signal and the second modulation signal,
wherein the controller is configured to determine a first position of a first object using at least the first electrical effects.

25. The controller of claim 24, further comprising a code generation module for producing the plurality of distinct digital codes.

26. The controller of claim 24, further comprising a signal generator for generating the carrier signal.

27. The controller of claim 26, wherein the signal generator comprises an oscillator.

28. The controller of claim 24, wherein the carrier signal has a periodically varying voltage.

29. The controller of claim 28, wherein the first modulation signal comprises the carrier signal amplitude modulated according to the first distinct digital code.

30. The controller of claim 28, wherein the first modulation signal comprises the carrier signal phase modulated according to the first distinct digital code.

31. The controller of claim 24, wherein the receive circuitry is further configured to determine the first position of the first object using the first electrical effects by demodulating the first resultant signal to remove effects of the carrier signal and effects of using the plurality of distinct digital codes.

32. The controller of claim 24, wherein the demodulating the first resultant signal further comprises filtering the first resultant signal.

33. The controller of claim 24, wherein the controller is further configured to be coupled to the plurality of transmit electrodes and the plurality of receive electrodes, wherein the plurality of transmit electrodes are disposed in a first direction and the plurality of receive electrodes are disposed in a second direction substantially orthogonal to the first direction.

34. The controller of claim 24, wherein the controller is further configured to determine a two-dimensional image using at least the first electrical effects.

35. The controller of claim 24, wherein the receive circuitry is further configured to receive a second resultant signal from a second receive electrode of the plurality of receive electrodes, the second resultant signal comprising second electrical effects associated with the first modulation signal and the second modulation signal, wherein the controller is further configured to determine a second position of a second object using at least the second resultant signal.

36. The controller of claim 35, wherein the controller is further configured to perform one action selected from a group of actions consisting of a scrolling action and a mode selection action in response to determining at least the first position of the first object and the second position of the second object.

37. The controller of claim 35, wherein the controller is further configured to:
identifying a user's palm in the two-dimensional image; and not reporting information about the user's palm.

38. The controller of claim 35, wherein the first object is a first pointer and the second object is a second pointer and wherein the first pointer and the second pointer are each a pointing object selected from a group consisting of: a finger and a stylus.

39. The controller of claim 35, wherein the controller is further configured to report the first position as first object coordinates and the second position as second object coordinates.

40. The controller of claim 35, wherein the first resultant signal and the second resultant signal are simultaneously received.

41. A method of capacitive sensing with a position sensor, the method comprising:
simultaneously transmitting a first modulation signal with a first transmit electrode of a plurality of transmit electrodes and a second modulation signal with a second transmit electrode of the plurality of transmit electrodes, wherein the first modulation signal comprises a carrier signal modulated according to a first distinct digital code of a plurality of distinct digital codes and the second modulation signal comprises the carrier signal modulated according to a second distinct digital code of the plurality of distinct digital codes, and wherein the carrier signal has a periodically varying voltage;
receiving a first resultant signal from a first receive electrode, wherein the first resultant signal comprises first electrical effects associated with the first modulation signal and the second modulation signal;
receiving a second resultant signal from a second receive electrode, wherein the second resultant signal comprises second electrical effects associated with the first modulation signal and the second modulation signal;
demodulating the first and second resultant signals to remove effects of the carrier signal and effects of using the first and second distinct digital codes, and extract the first and second electrical effects; and
determining a first position of a first object and second position of a second object based on the electrical effects.

42. The method of claim 41, wherein the method further comprises adjusting a frequency of the carrier signal in response to electrical noise.

43. A controller for a capacitive position sensor, the controller comprising:
drive circuitry configured to simultaneously apply a first modulation signal to a first transmit electrode and a second modulation signal to a second transmit electrode, wherein the first modulation signal comprises a carrier signal modulated using a first distinct digital code and the second modulation signal comprises the carrier signal modulated using a second distinct digital code, and wherein the carrier signal has a periodically varying voltage; and
receive circuitry configured to:
receive a first resultant signal from a first receive electrode, the first resultant signal comprising first electrical effects associated with the first modulation signal and the second modulation signal; and
receive a second resultant signal from a second receive electrode, the second resultant signal comprising second electrical effects associated with the first modulation signal and the second modulation signal,
wherein the controller is configured to:
demodulate the first and second resultant signals to remove effects of the carrier signal and effects of using the first and second distinct digital codes, and extract the first and second electrical effects;
define a two-dimensional image using at least the first and second electrical effects; and
determine positions of a first object and a second object in a sensing region of the capacitive position sensor using the first and second electrical effects.

44. The controller of claim 43, wherein the controller is further configured to adjust a frequency of the carrier signal in response to electrical noise.

* * * * *